United States Patent
Bolotnikov et al.

(10) Patent No.: US 10,096,681 B2
(45) Date of Patent: Oct. 9, 2018

(54) ELECTRIC FIELD SHIELDING IN SILICON CARBIDE METAL-OXIDE-SEMICONDUCTOR (MOS) DEVICE CELLS

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: General Electric Company, Schenectady, NJ (US)

( * ) Notice: Subject to any disclaimer, the term of this patent is extended or adjusted under 35 U.S.C. 154(b) by 0 days.

(21) Appl. No.: 15/595,611

(22) Filed: May 15, 2017

(65) Prior Publication Data

US 2017/0338313 A1 Nov. 23, 2017

Related U.S. Application Data

(60) Provisional application No. 62/340,396, filed on May 23, 2016.

(51) Int. Cl.
*H01L 29/78* (2006.01)
*H01L 29/16* (2006.01)
(Continued)

(52) U.S. Cl.
CPC ........ *H01L 29/1608* (2013.01); *H01L 21/046* (2013.01); *H01L 21/0465* (2013.01);
(Continued)

(58) Field of Classification Search
CPC ............. H01L 29/1608; H01L 29/0623; H01L 29/7816; H01L 29/063; H01L 21/0465;
(Continued)

(56) References Cited

U.S. PATENT DOCUMENTS 8,212,321 B2 7/2012 Lamey et al.
8,421,148 B2 4/2013 Harris et al.
(Continued)

FOREIGN PATENT DOCUMENTS

CN 202816955 U 3/2013
DE 102004009602 B4 9/2009
(Continued)

OTHER PUBLICATIONS

PCT/US2017/033955 Search Report with written opinion, dated Aug. 21, 2017.

*Primary Examiner* — Selim Ahmed
(74) *Attorney, Agent, or Firm* — GE Global Patent Operation; John P. Darling

(57) ABSTRACT

The subject matter disclosed herein relates to semiconductor power devices, such as silicon carbide (SiC) power devices. In particular, the subject matter disclosed herein relates to disconnected or connected shielding regions that reduce the electric field present between the well regions of neighboring device cells of a semiconductor device under reverse bias. The disclosed shielding regions occupy a widest portion of the JFET region between adjacent device cells such that a distance between a shielding region and well regions surrounding device cell is less than a parallel JFET width between two adjacent device cells, while maintaining a channel region width and/or a JFET region density that is greater than that of a comparable conventional stripe device. As such, the disclosed shielding regions and device layouts enable superior performance relative to a conventional stripe device of comparable dimensions, while still providing similar reliability (e.g., long-term, high-temperature stability at reverse bias).

18 Claims, 17 Drawing Sheets

(51) Int. Cl.
*H01L 29/06* (2006.01)
*H01L 21/04* (2006.01)
*H01L 29/66* (2006.01)
*H01L 29/10* (2006.01)
*H01L 29/745* (2006.01)
*H01L 29/739* (2006.01)
*H01L 29/74* (2006.01)

(52) U.S. Cl.
CPC ........ *H01L 29/063* (2013.01); *H01L 29/0623* (2013.01); *H01L 29/0646* (2013.01); *H01L 29/0696* (2013.01); *H01L 29/1095* (2013.01); *H01L 29/66068* (2013.01); *H01L 29/7395* (2013.01); *H01L 29/7455* (2013.01); *H01L 29/78* (2013.01); *H01L 29/7802* (2013.01); *H01L 29/7816* (2013.01); *H01L 29/7393* (2013.01); *H01L 29/74* (2013.01)

(58) Field of Classification Search
CPC ............ H01L 29/7802; H01L 29/7395; H01L 29/7455; H01L 29/1095; H01L 21/046; H01L 29/78; H01L 29/0646; H01L 29/0696; H01L 29/06
See application file for complete search history.

(56) References Cited

U.S. PATENT DOCUMENTS

| | | | |
|---|---|---|---|
| 8,674,440 | B2 | 3/2014 | Korec |
| 9,318,547 | B2 | 4/2016 | Kumagai |
| 2001/0001494 | A1 | 5/2001 | Kocon |
| 2004/0099885 | A1 | 5/2004 | Yeo et al. |
| 2004/0164304 | A1 | 8/2004 | Magri et al. |
| 2013/0082320 | A1 | 4/2013 | Alberhasky et al. |
| 2013/0200451 | A1 | 8/2013 | Yilmaz et al. |
| 2013/0313570 | A1 | 11/2013 | Sdrulla et al. |
| 2014/0231912 | A1 | 8/2014 | Willmeroth et al. |
| 2014/0367771 | A1* | 12/2014 | Chatty ................ H01L 29/0623 257/329 |
| 2015/0053999 | A1* | 2/2015 | Kumagai ............ H01L 29/0615 257/77 |
| 2015/0287777 | A1 | 10/2015 | Kumagai |

FOREIGN PATENT DOCUMENTS

DE 112014003637 4/2016
WO 20066024322 A1 3/2006

* cited by examiner

ELECTRIC FIELD SHIELDING IN SILICON CARBIDE METAL-OXIDE-SEMICONDUCTOR (MOS) DEVICE CELLS

CROSS-REFERENCE TO RELATED APPLICATIONS

This application claims priority from and the benefit of U.S. Provisional Application Ser. No. 62/340,396, entitled "ELECTRIC FIELD SHIELDING IN SILICON CARBIDE METAL-OXIDE-SEMICONDUCTOR (MOS) DEVICE CELLS," filed May 23, 2016, which is hereby incorporated by reference in its entirety for all purposes.

BACKGROUND

The subject matter disclosed herein relates to semiconductor power devices, such as silicon carbide (SiC) power devices, including field transistors (e.g., MOSFET, DMOSFET, UMOSFET, VMOSFET, trench MOSFET, etc.), insulated gate bipolar transistors (IGBT), and insulated base MOS-controlled thyristors (IBMCT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors).

Specifically for high-frequency, high-voltage, and/or high-current applications, silicon carbide (SiC) devices, may provide a number of advantages in terms of high temperature operation, reduced conduction and switching losses, and smaller die size than corresponding silicon (Si) devices. However, SiC also presents a number of technical and design challenges relative to Si, such as lower dopant diffusion during SiC device fabrication and higher electric fields within SiC devices during operation (e.g., under reverse bias). While the SiC portions of a SiC device may be robust to these higher electric fields, other portions of the SiC device, such as silicon oxide ($SiO_2$) dielectric layers, may fail under these higher electric fields. Accordingly, it is desirable to develop SiC device designs that reduce high electric fields to improve device reliability without substantially diminishing device performance.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be within the spirit of the present technique. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art. Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

Figure 1A:
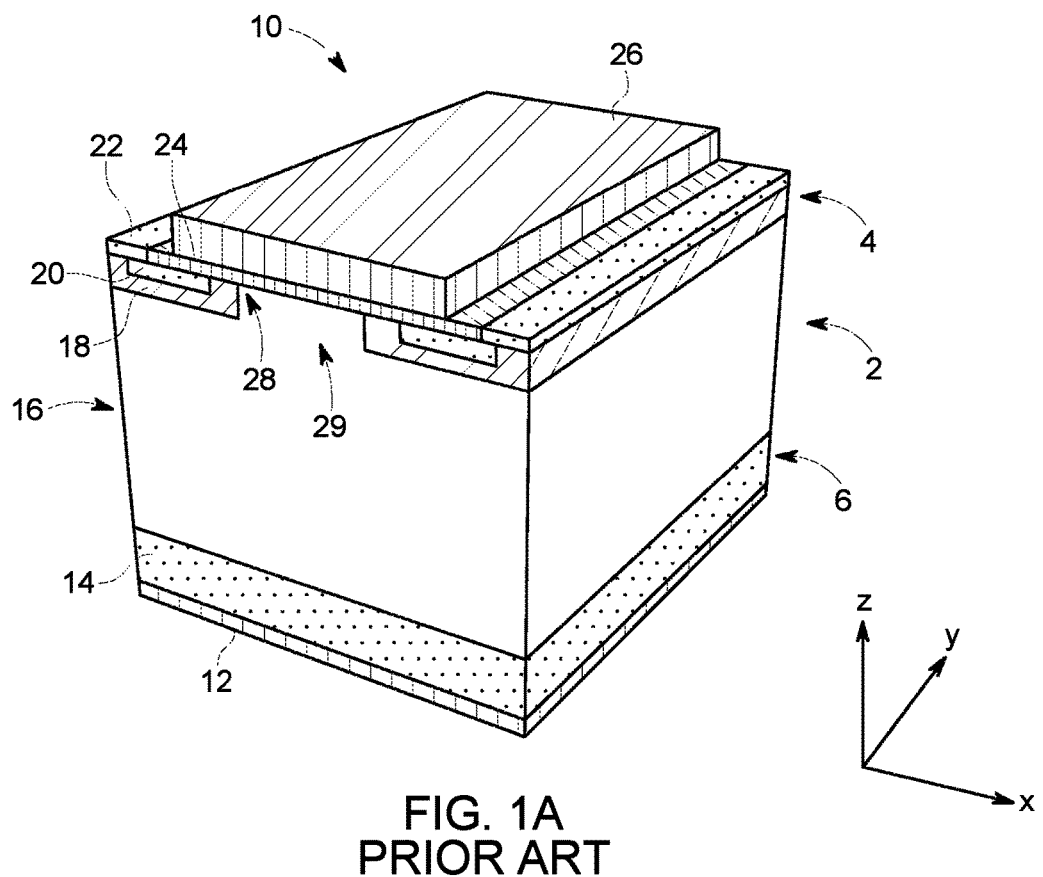
FIG. 1A is a schematic of a typical planar MOSFET device.

One of the essential building blocks of modern power electronics is the field-effect transistor (FET) device. For example, FIG. 1A illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted.

The illustrated MOSFET device 10 of FIG. 1A includes a semiconductor device layer 2 (e.g., an epitaxial SiC layer) having a first surface 4 and a second surface 6. The semiconductor device layer 2 includes a drift region 16 having a first conductivity type (e.g., an n-type drift layer 16), a well region 18 having a second conductivity type (e.g., a p-well 18) disposed adjacent to the drift region 16 and proximal to the first surface 4. The semiconductor device layer 2 also includes a source region 20 having the first conductivity type (e.g., n-type source region 20) adjacent to the well region 18 and proximal to the first surface 4. A dielectric layer 24 (also referred to as a gate insulating layer or gate dielectric layer) is disposed on a portion of the first surface 4 of the semiconductor device layer 2, and a gate electrode 26 is disposed on the dielectric layer 24. The second surface 6 of the semiconductor device layer 2 is a substrate layer 14 (e.g., a SiC substrate layer), and the drain contact 12 is disposed on the bottom of device 10 along the substrate layer 14.

During on-state operation, an appropriate gate voltage (e.g., at or beyond a threshold voltage (VTR) of the MOSFET device 10) may cause an inversion layer to be formed in the channel region 28, as well as a conductive path to be enhanced in the junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and gate dielectric 24. Furthermore, while the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable wide band-gap semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing both n- and p-channel designs.

Figure 1B:
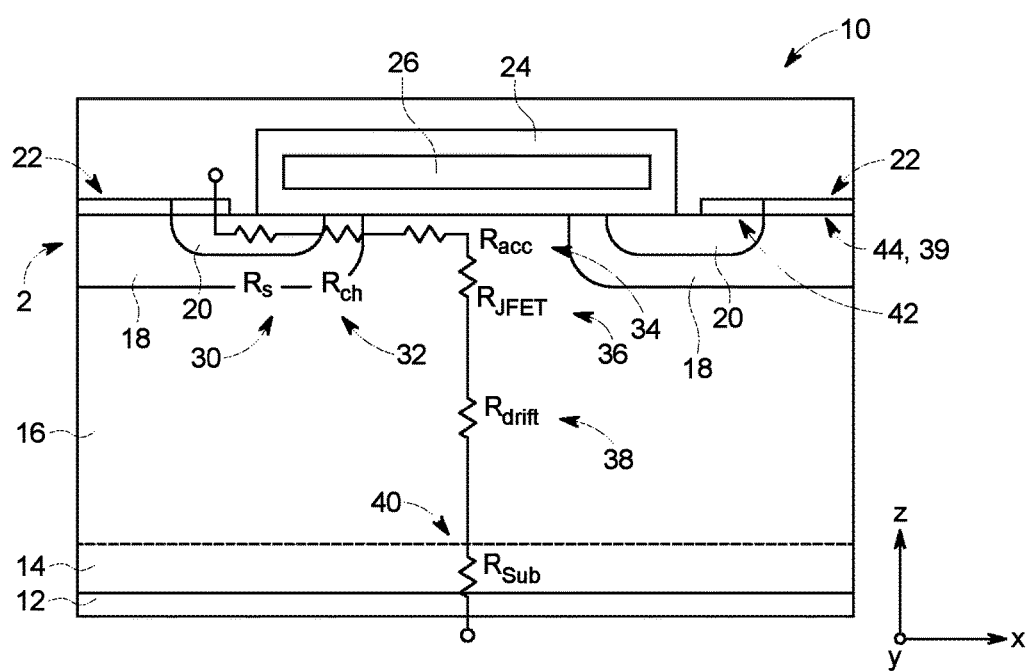
FIG. 1B is a schematic illustrating resistances for various regions of a typical MOSFET device.

FIG. 1B is a schematic cross-sectional view of the SiC device 10 of FIG. 1A. The source contacts 22 of the MOSFET device 10 illustrated in FIG. 1B generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., n+ source region 20) of the MOSFET device 10 disposed below the contact 22 may be more specifically referred to herein as a source contact region 42 of the MOSFET device 10. Similarly, a portion of the well region 18 of the MOSFET device 10, which may be doped at a higher level than the remainder of the well region 18, may be more specifically referred to herein as a body region 39 (e.g., p+ body region 39) of the MOSFET device 10. For clarity, the portion of the body region 39 that is disposed below (e.g., covered by, directly electrically connected to) the contact 22, may be more specifically referred to herein as a body contact region 44 (e.g., p+ body contact region 44) of the MOSFET device 10.

As illustrated in FIG. 1B, the various regions of the MOSFET device 10 may each have an associated resistance, and a total resistance (e.g., an on-state resistance, $R_{ds}(on)$) of the MOSFET device 10, which may be represented as a sum of each of these resistances. For example, as illustrated in FIG. 1B, on-state resistance, $R_{ds}(on)$, of the MOSFET device 10 may be approximated as a sum of: a resistance $R_s$ 30 (e.g., a resistance of source region 20 and a resistance of the contact 22); a resistance $R_{ch}$ 32 (e.g., an inversion channel resistance of the region 28 illustrated in FIG. 1A); a resistance $R_{acc}$ 34 (e.g., a resistance of an accumulation layer between the gate oxide 24 and portion of drift layer 16 located between well regions 18); a resistance $R_{JFET}$ 36 (e.g., resistance of undepleted neck region between well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 1B are not intended to be exhaustive, and that other resistances (e.g., drain contact resistance, spreading resistance, etc.) could potentially be present within the semiconductor device 10.

In certain cases, one or two resistance components illustrated in FIG. 1B may dominate conduction losses of the semiconductor device 10, and addressing these factors can significantly impact $R_{ds}(on)$. For example, for devices in which the drift resistance 38, the substrate resistance 40 and the contact resistance 30 are less significant (compared to other resistance components), such as low-voltage devices or devices suffering from low inversion layer mobility (e.g. SiC devices), the channel resistance ($R_{ch}$ 32) may account for a significant portion of device conduction losses. By further example, in medium- and high-voltage devices, JFET region resistance ($R_{JFET}$ 36) may account for a significant portion of total conduction losses.

Figure 2:
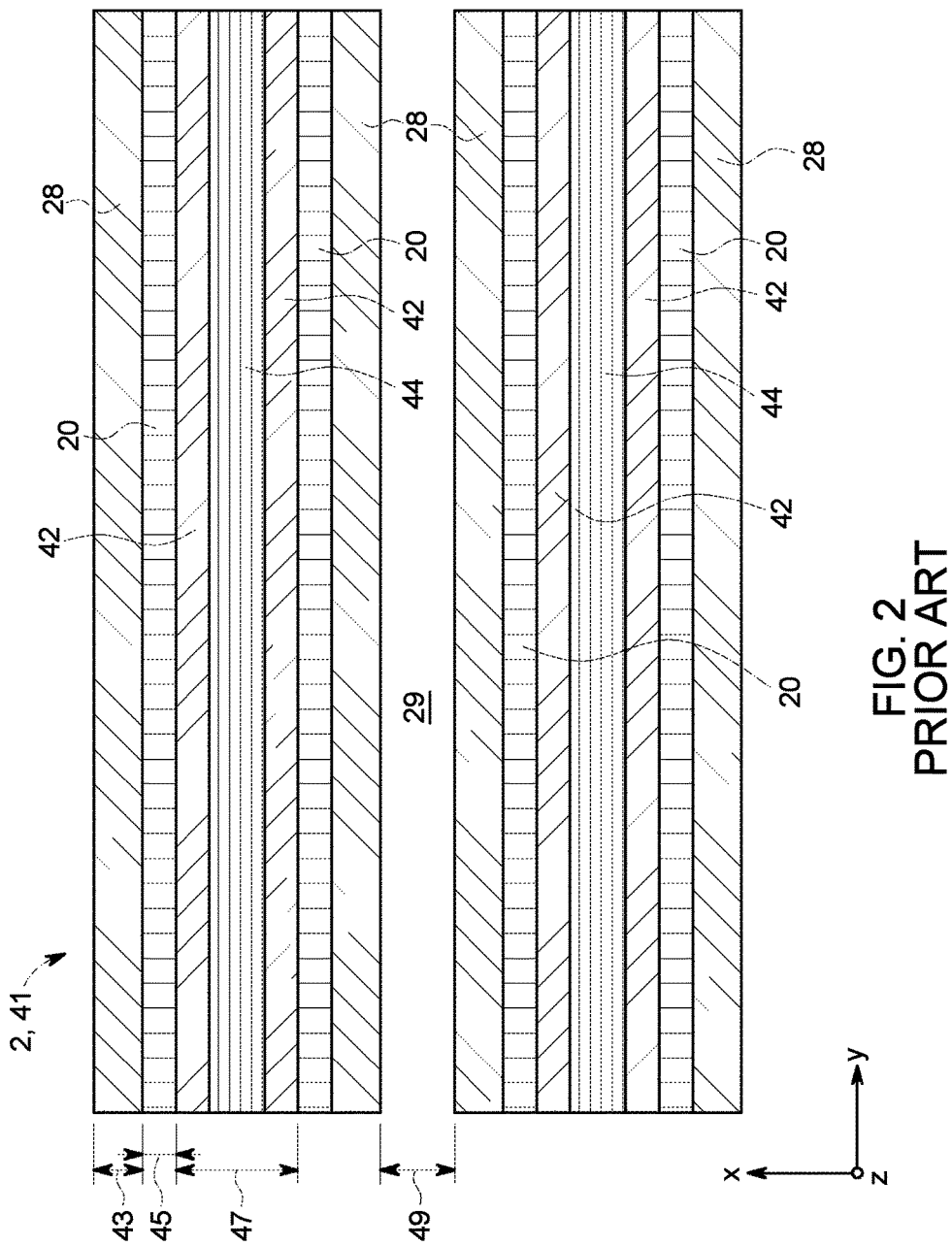
FIG. 2 is a top-down view of a surface of a SiC layer that includes a typical MOSFET device structure having a stripe cell layout.

FIG. 2 illustrates a top-down view of a semiconductor device layer 2 including a MOSFET device structure 41 having a conventional stripe cell layout. In terms of dimensions, the conventional MOSFET device structure 41 may be described as having a particular channel length ($L_{ch}$ 43), length from channel region to ohmic region ($L_{ch\_to\_ohm}$ 45), width of the ohmic region ($W_{ohm}$ 47), and width of the JFET region ($W_{JFET}$ 49). While the conventional stripe cell layout illustrated in FIG. 2 offers good reliability (e.g., long term and high temperature performance), the relatively high channel resistance ($R_{ch}$ 32) and JFET resistance ($R_{JFET}$ 36) of the MOSFET device structure 41 results in a relatively high $R_{ds}(on)$, which diminishes the electrical performance of the device.

Figure 3:
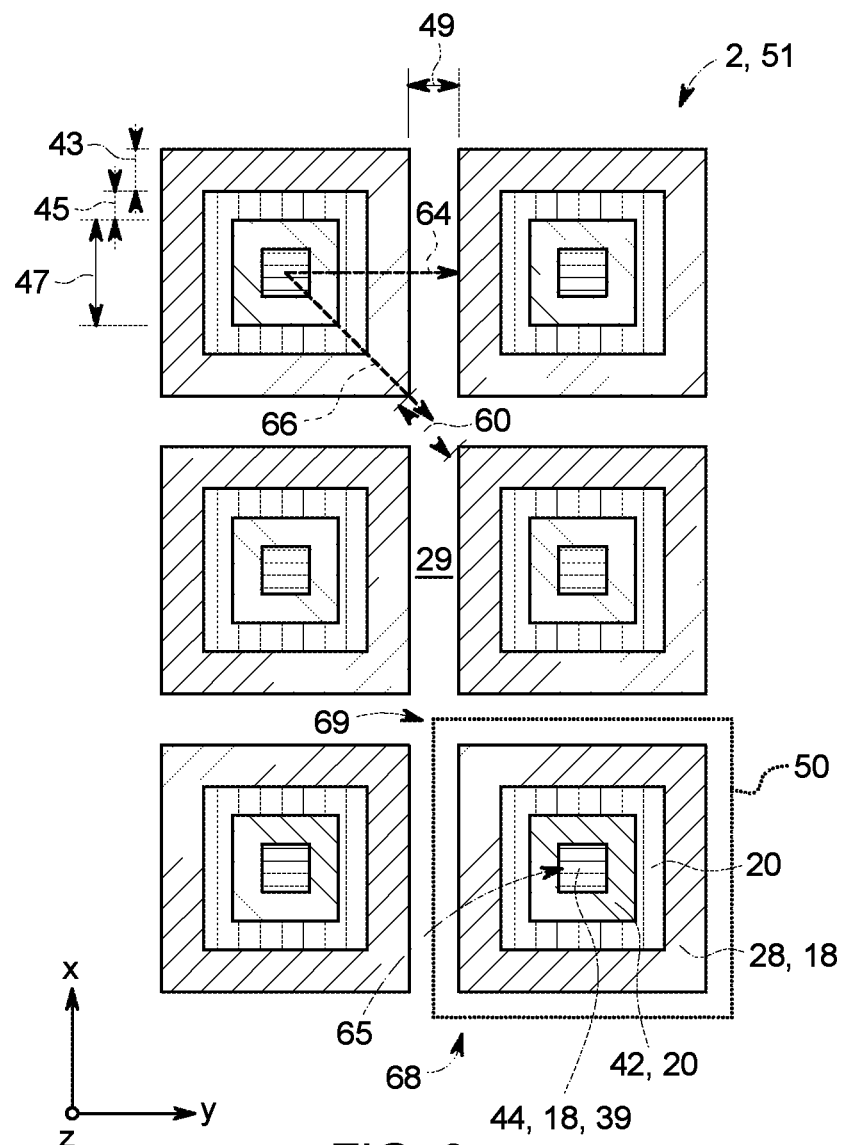
FIG. 3 is a top-down view of a SiC layer that includes a number of square semiconductor device cells.
Figure 4:
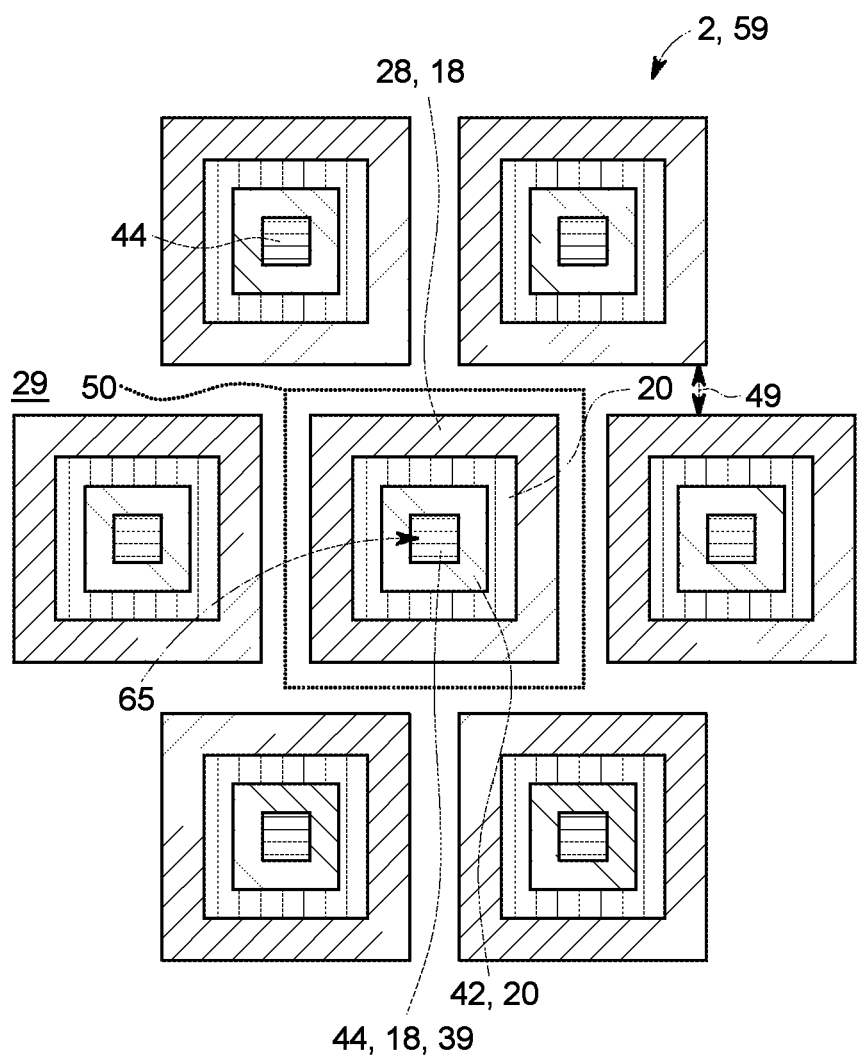
FIG. 4 is a top-down view of a SiC layer that includes a number of staggered square semiconductor device cells.
Figure 5:
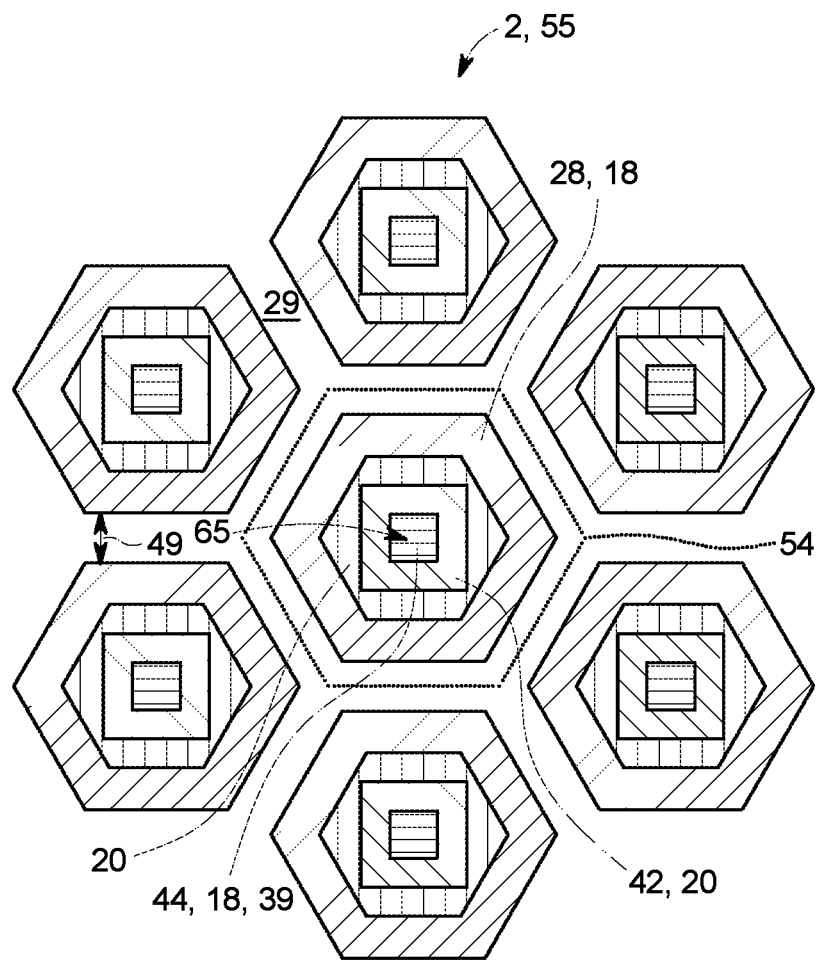
FIG. 5 is a top-down view of a SiC layer that includes a number of hexagonal semiconductor device cells.

One way in which channel resistance ($R_{ch}$ 32) and JFET resistance ($R_{JFET}$ 36) can be reduced for semiconductor devices is through the use of cellular device designs. FIGS. 3-5 illustrate top-down views of a semiconductor device layer 2 having different conventional cellular designs and layouts. These conventional designs may be described as being unshielded relative to the shielded device cells of the present technique discussed below. It may be appreciated that for FIGS. 3-5, as well as for the top-down views of device cells presented below, certain features of the device cells (e.g., gate contact 26, dielectric layer 24, contacts 22) are omitted to provide an unobstructed view of the surface of the semiconductor device layer 2. In particular, FIG. 3 illustrates square device cells 50 in an aligned layout 51, while FIG. 4 illustrates the square cellular device cells 50 in a staggered or offset layout 52. FIG. 5 illustrates hexagonal device cells 54 in an aligned layout 55. In general, the illustrated cell designs and layouts illustrated in FIGS. 3-5 enable reduced $R_{ds}(on)$ by reducing both channel resistance ($R_{ch}$ 32) and the JFET resistance ($R_{JFET}$ 36) relative to a stripe cell layout, as illustrated in FIG. 2. For example, the square device cells 50 of FIG. 3 provide an approximately 20% lower $R_{ds}(on)$ than the stripe device 41 of FIG. 2, assuming similar process/technology limited dimensions (e.g., same $L_{ch}$ 43, $L_{ch\_to\_ohm}$ 45, $W_{ohm}$ 47, and $W_{JFET}$ 49). It may be appreciated that the layouts illustrated herein using a few device cells that represent a subset of the numerous device cells of a semiconductor device on the semiconductor surface 2.

In FIGS. 3-5, the illustrated conventional square device cell 50 and hexagonal device cell 54 each include a body contact region 44 disposed in the center 65 of each cell that, as illustrated in FIG. 1B, is part of the well region 18. The body contact region 44 is surrounded by a source region 20. More specifically, the body contact region 44 of each cell may be surrounded by the source contact region 42 of the source region 20, wherein the doping of the source contact region 42 may be the same as the remainder of the source region 20. The source region 20 of each cell is surrounded by a channel region 28, which also is part of the well region 18, as illustrated in FIGS. 1A and 1B. The channel region 28 is, in turn, surrounded by the JFET region 29. In general, the width of a particular part of the JFET region 29 is defined as the shortest distance between regions having the opposite doping type (e.g., p-type) compared that of JFET region 29 (e.g., n-type). While each device cell includes a JFET region 29 about the perimeter of the cell, these JFET regions 29 may, at times, be collectively referred to as the JFET region 29 of the semiconductor device layer 2 for simplicity. It may also be appreciated that the semiconductor device layer 2, the source region 20, including the source contact region 42, and the JFET region 29 have a first conductivity type (e.g., n-type), while well region 18, including the body contact region 44 and the channel region 28 have a second conductivity type (e.g., p-type). As used herein, two device cells may be referred to as neighboring cells or adjacent cells when any portion of the boundaries of the two cells touch (e.g., along a side 68 or at a corner 69 of the boundary the device cells). As such, it may be appreciated that, each square device cell 50 of FIG. 3 has eight neighboring or adjacent cells, while each staggered square cell 50 of FIG. 4 and each hexagonal device cell 54 of FIG. 5 has six neighboring or adjacent cells.

While the cellular designs illustrated in FIGS. 3-5 may enable lower $R_{ds}(on)$ relative to a stripe cell layout, as illustrated in FIG. 2, it is presently recognized that such cellular designs can have a substantially higher electric field in portions of the JFET region 29 between the corners of the well regions of neighboring device cells under blocking conditions. For SiC MOS devices, the electric field in the dielectric layer 24 (e.g., SiO$_2$) disposed over the JFET region 29 (illustrated in FIGS. 1 and 2) may be around ten times higher compared to that in Si devices when the device cells operate under reverse bias. While SiC is generally robust toward higher electric fields, the dielectric layer 24 may experience breakdown during long term operation, resulting in reliability issues with the SiC device cells 50 and 54.

Figure 6:
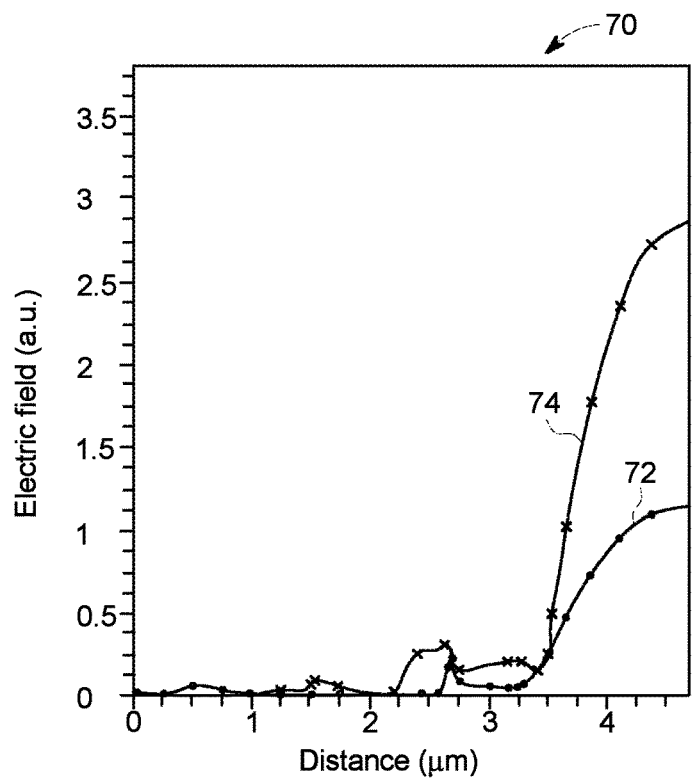
FIG. 6 is a graph depicting normalized electric field strength in a portion of a SiC layer and in a portion of a dielectric layer disposed over the SiC layer, wherein the portion of the SiC layer is disposed between parallel portions of unshielded square device cells under reverse bias.

In particular, in a SiC MOSFET under reverse bias, the electric field present in the widest portion of the JFET region 29 between the corners of the well regions of neighboring device cells 50 and 54 illustrated in FIGS. 3-5 is substantially higher than in other portions of the JFET region 29. As illustrated in FIG. 3, the diagonal distance 60 between the corners of the channel regions 28 of the device cells 50 is greater than the distance 49 between parallel portions (i.e., $W_{JFET,parallel}$ 49) of the channel regions 28 of neighboring device cells 50. FIG. 6 is a graph 70 that plots the strength of the electric field (in arbitrary units (au)) under reverse bias for portions of an unshielded device cell 50 disposed along the arrow 64 illustrated in FIG. 3. More specifically, FIG. 6 includes a first curve 72 illustrating the electric field in the JFET region 29 in FIG. 1A, and includes a second curve 74 illustrating the electric field in the dielectric layer 24 (as illustrated in FIGS. 1A and 1B), for the example unshielded device cell 50 (i.e., 1200 V SiC MOSFET square device cells, having $8\times10^{15}$ cm$^{-3}$ epi doped and 11 μm thick drift layer, wherein $W_{JFET,parallel}$ 49 is 2.6 μm) at $V_{ds}$=1200 V. As illustrated in the graph 70 of FIG. 6, at the center 65 of the device cell 50 (i.e., at x=0 μm) the electric field in both the semiconductor device layer 2 and the dielectric layer 24 is low, and the electric field increases to a maximum field strength in the middle of the JFET region 29 (i.e., at approximately x=4.7 μm).

Figure 7A:
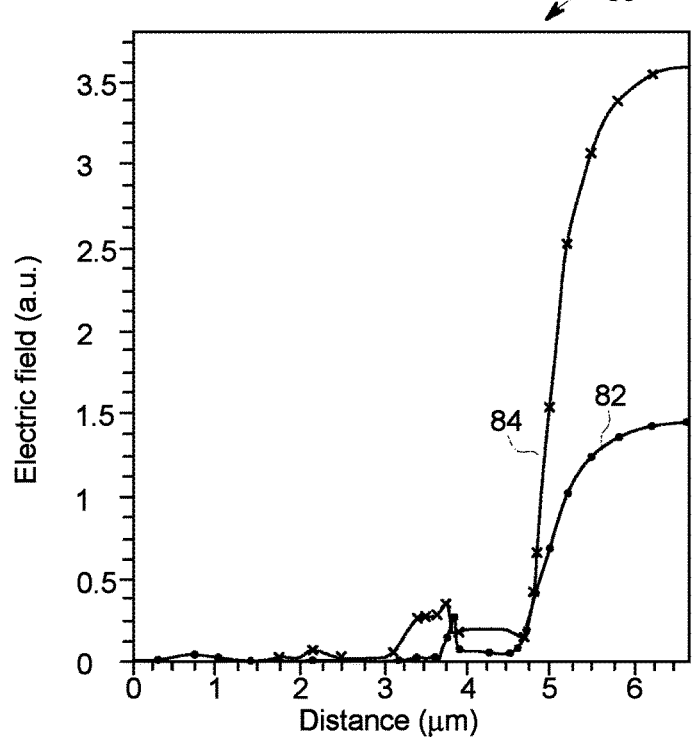
FIG. 7A is a graph depicting normalized electric field strength in a portion of a SiC layer and in a portion of a dielectric layer disposed over the SiC layer, wherein the portion of the SiC layer is disposed between the corners of the well regions of unshielded square device cells under reverse bias.

FIG. 7A is a graph 80 that plots the strength of the electric field (in arbitrary units (au)) for portions of an unshielded SiC device cell 50 under reverse bias, wherein the portions are disposed along the diagonal arrow 66 illustrated in FIG. 3. Like FIG. 6, the graph 80 of FIG. 7A includes a first curve 82 illustrating the electric field in the semiconductor device layer 2, and includes a second curve 84 illustrating the electric field in the dielectric layer 24 disposed over the semiconductor device layer 2 (as illustrated in FIGS. 1A and 1B), for an example conventional SiC device cell 50 having the same dimensions and conditions as indicated for FIG. 6. As illustrated in FIG. 7A, at the center of the conventional SiC device cell 50 (i.e., at x=0 μm) the electric field is low, and, moving diagonally through the corner of the conventional device cell 50, the electric field increases to a peak field strength in the middle of the JFET region 29 (i.e., at approximately x=6.65 μm). Comparing FIGS. 6 and 7, for the example unshielded SiC square cells 50, the peak or maximum electric field between cell corners (i.e., distance 60, along the arrow 66 of FIG. 3) is approximately 20% higher than the peak or maximum electric field between parallel portions of the cells 50 (i.e., distance 49, along the arrow 64 of FIG. 3). As a result, as shown in FIG. 7A, the peak electric field in the dielectric layer 24 is greater between the corners of the well regions 18 of neighboring device cells 50 (e.g., between the corners of the channel regions 28 of neighboring device cells, at the corner 69 where neighboring cells meet), which may result in long term reliability issues for such unshielded device cells 50.

With the foregoing in mind, present embodiments are directed toward cellular device designs that incorporate one or more shielding regions, in the form of disconnected/connected shielding regions, that reduce the electric field in the JFET regions 29 (as well as in the gate dielectric layer 24 illustrated in FIG. 1B) in locations where the corners 69 of neighboring device cells meet without significantly increasing $R_{ds}$(on). Accordingly, the shielding regions of the presently disclosed devices are designed so that the distance between the shielding regions and well regions of neighboring device cells less than or equal to the distance between parallel portions of the well regions of the neighboring device cells. Therefore, the present designs ensure no portion of the JFET region 29 is wider than the width of the JFET region 29 between parallel portions of the channel regions of neighboring device cells (i.e., $W_{JFET,parallel}$ 49). Further, present designs maintain a channel region width and/or a JFET region density that is greater than or equal to that of a conventional stripe device (e.g., stripe cell device 41 of FIG. 2) having comparable dimensions (e.g., same $L_{ch}$, $L_{ch\_to\_ohm}$, $W_{ohm}$). As such, the presently disclosed shielded device cells provide superior performance relative to a conventional stripe device cells of comparable dimensions, while still providing similar reliability (e.g., long-term, high-temperature stability). Furthermore, the shielding regions of the presently disclosed cellular designs may be implanted simultaneously with other features of the device cells (e.g., body contact region 44, well region 18, termination region), and as such, do not increase the complexity or cost of fabrication.

Accordingly, present embodiments are directed toward cellular device designs that incorporate other types of implanted shielding regions to reduce the peak electric field in the JFET regions 29 (as well as in the gate dielectric layer 24 illustrated in FIG. 1B) above the JFET region, without significantly increasing $R_{ds}$(on). It may be appreciated that other types of shielding regions are implanted as extensions that extend a feature (e.g., a body region, channel region, source region) of a device cell beyond its typical boundaries. In contrast, the presently disclosed shielding regions do not extend a feature (e.g., a body region, channel region) of a device cell, but rather are implanted in the portion of the JFET region in which device cells meet (e.g., between the corners of the well regions of neighboring device cells). The disclosed shielding regions reduce the electric field in this portion of the JFET region while maintaining a channel region width/periphery and/or a JFET region density that is greater than or equal to that of a conventional stripe device (e.g., stripe device 41 of FIG. 2) having comparable process/technology limited dimensions (e.g., same $L_{ch}$, $L_{ch\_to\_ohm}$, $W_{ohm}$). As such, the presently disclosed shielded device cells provide superior performance relative to a conventional stripe device of comparable dimensions, while still providing similar reliability (e.g., long-term, high-temperature stability under reverse bias). Furthermore, the shielding regions of the presently disclosed cellular layouts may be implanted simultaneously with other features of the device cells, and as such, do not increase the complexity or cost of fabrication As discussed below, in certain embodiments, the presently disclosed shielding regions may be in the form of either disconnected or connected shielding regions. As used herein, a "disconnected shielding region" refers to a shielding region that is disposed within the JFET region (e.g., entirely surrounded by the JFET region) and does not overlap with the well regions of one or more device cells. In contrast, a "connected shielding region," as used herein, refers to a shielding region that is disposed within the JFET region and overlaps with at least the well region of one or more device cells. It may be appreciated that, while the disclosed layouts having the connected shielding regions provide effective shielding, they may also result in slightly higher $R_{ds}$(on), relative to layouts that include disconnected shielding regions, due to a slightly lower channel density. It may be generally noted that the disclosed disconnected and connected shielding regions generally do not extend into the source region, the source contact region, or the body contact region of the device cells. As discussed in greater detail below, in general, these shielding regions are arranged such that the distances between the shielding region and the well regions 18 of adjacent device cells are less than the distance between parallel portions of the well regions 18 of neighboring device cells (i.e., $W_{JFET,parallel}$ 49). As a result, since the distance between the shielding region the well region of adjacent device cell then defines the width of this portion the JFET region 29, the disclosed shielding regions ensure that no portion of the JFET region 29 is wider than $W_{JFET,parallel}$ 49, suppressing aforementioned peak electric fields and improving device reliability.

It may also be appreciated that, in certain embodiments, the disclosed shielding regions may be formed using the same implantation step used to form the body contact region 44 (e.g., a p+ implantation step), in which case the shielding regions may be substantially the same as the body contact region in terms of doping concentration and depth. For such p+ shielding region embodiments, the source/body contact (i.e., an ohmic, metallic contact) should be disposed over and directly electrically coupled to the disclosed shielding regions. In other embodiments, the disclosed shielding regions may be formed using a termination implantation step (e.g., a junction termination extension (JTE) implantation step), in which case the shielding regions generally have the same doping concentration and depth as the features formed during the termination implantation step. For such embodiments, the source/body contact may not be disposed over (i.e., not directly electrically coupled to) the shielding regions. Additionally, the disclosed shielding regions may have a particular width, or a maximum width, that is generally the same size or smaller than the width of the other features defined during the same implant operation (e.g., the width of the body contact region, the width of the JTE sub-region). In certain embodiments, the disclosed shielding regions may have a width (i.e., a largest dimension) that is defined or limited by the lower practically achievable limit for defining features using present implantation and/or lithography techniques. For example, in certain embodiments, the width of the disclosed shielding regions (e.g., diameter of a circular shielding region, longest side or height of a triangular shielding region, largest dimension of an irregular shape, etc.) may be less than approximately 2 µm (e.g., between approximately 0.1 µm and approximately 2 µm, between approximately 0.2 µm and approximately 1 µm) or less than approximately 0.5 µm (e.g., between approximately 0.1 µm and approximately 0.5 µm).

Figure 8:
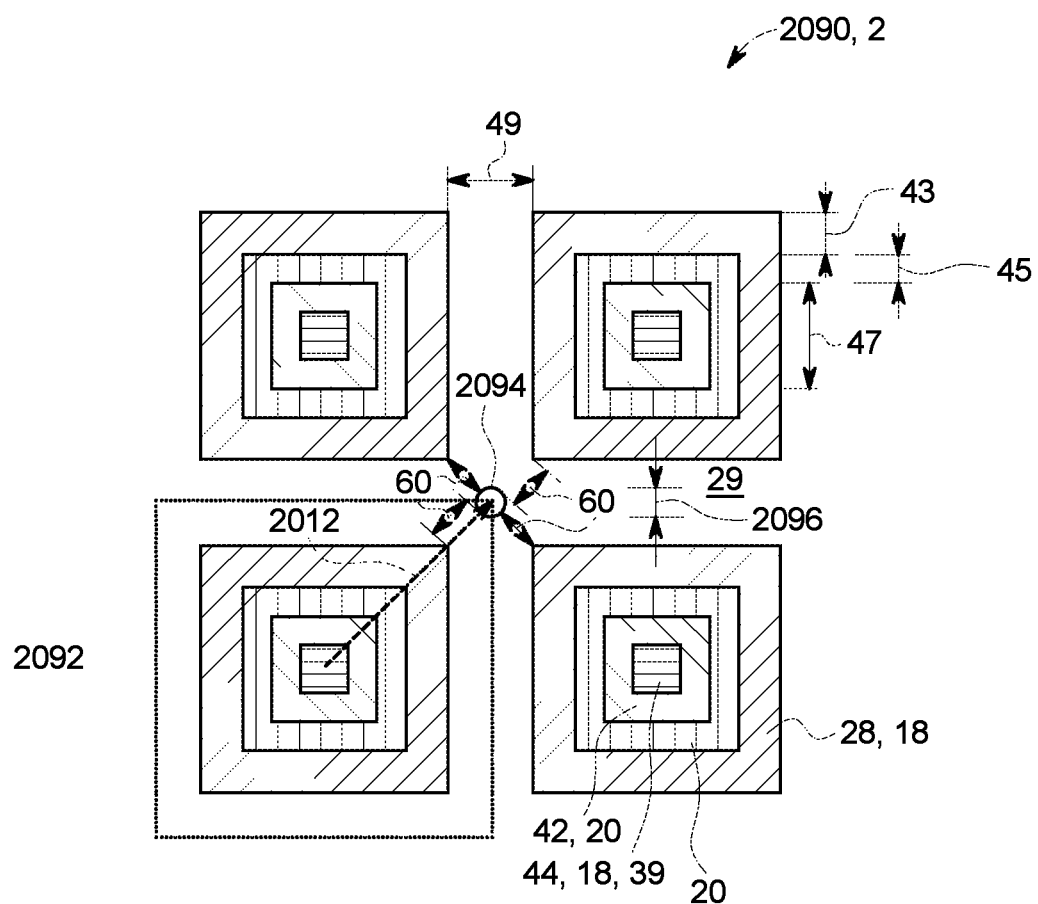
FIG. 8 is a top-down view of a device layout that includes a number of square device cells and a disconnected shielding region, in accordance with embodiments of the present technique.
Figure 9:
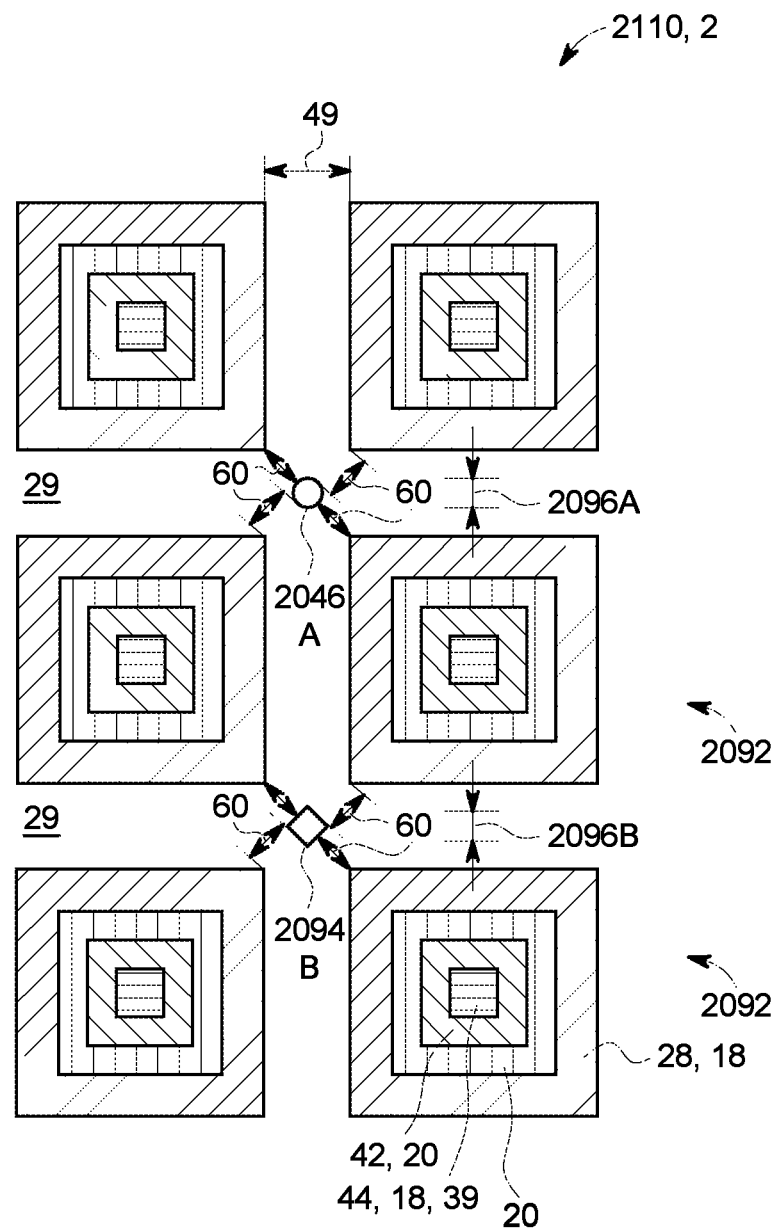
FIG. 9 is a top-down view a device layout that includes a number of square device cells and differently shaped disconnected shielding regions, in accordance with embodiments of the present technique.
Figure 10:
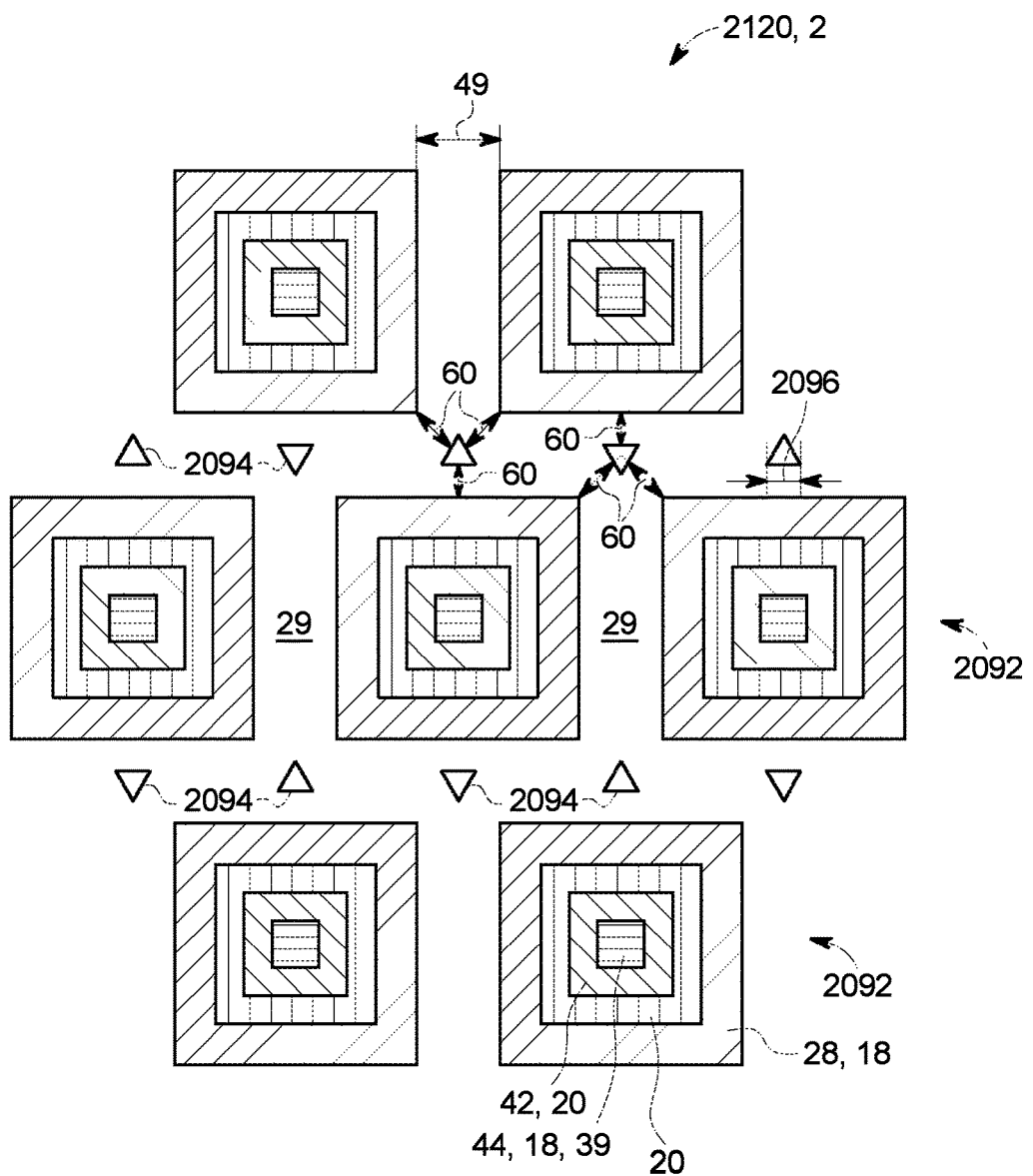
FIG. 10 is a top-down view of a device layout depicting a number of staggered, square device cells and triangular disconnected shielding regions, in accordance with embodiments of the present technique.
Figure 11:
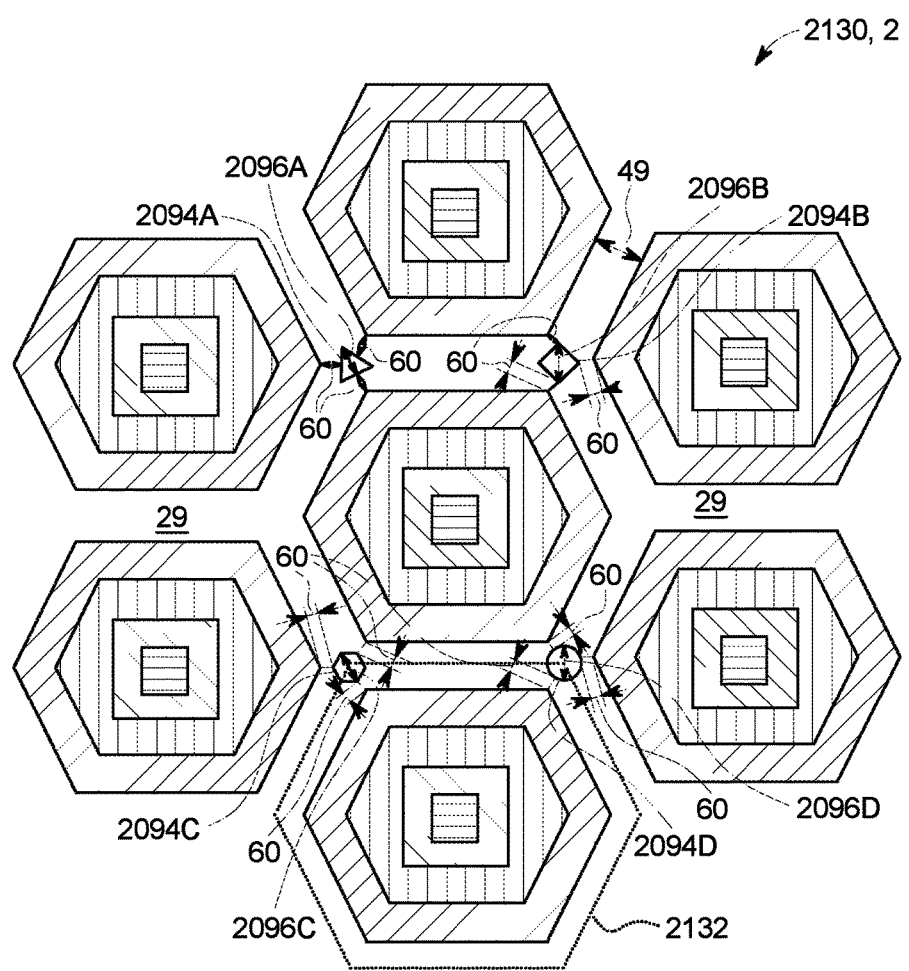
FIG. 11 is an example of a top-down view of a device layout that includes a number of hexagonal device cells and differently shaped disconnected shielding regions, in accordance with embodiments of the present technique.
Figure 12:
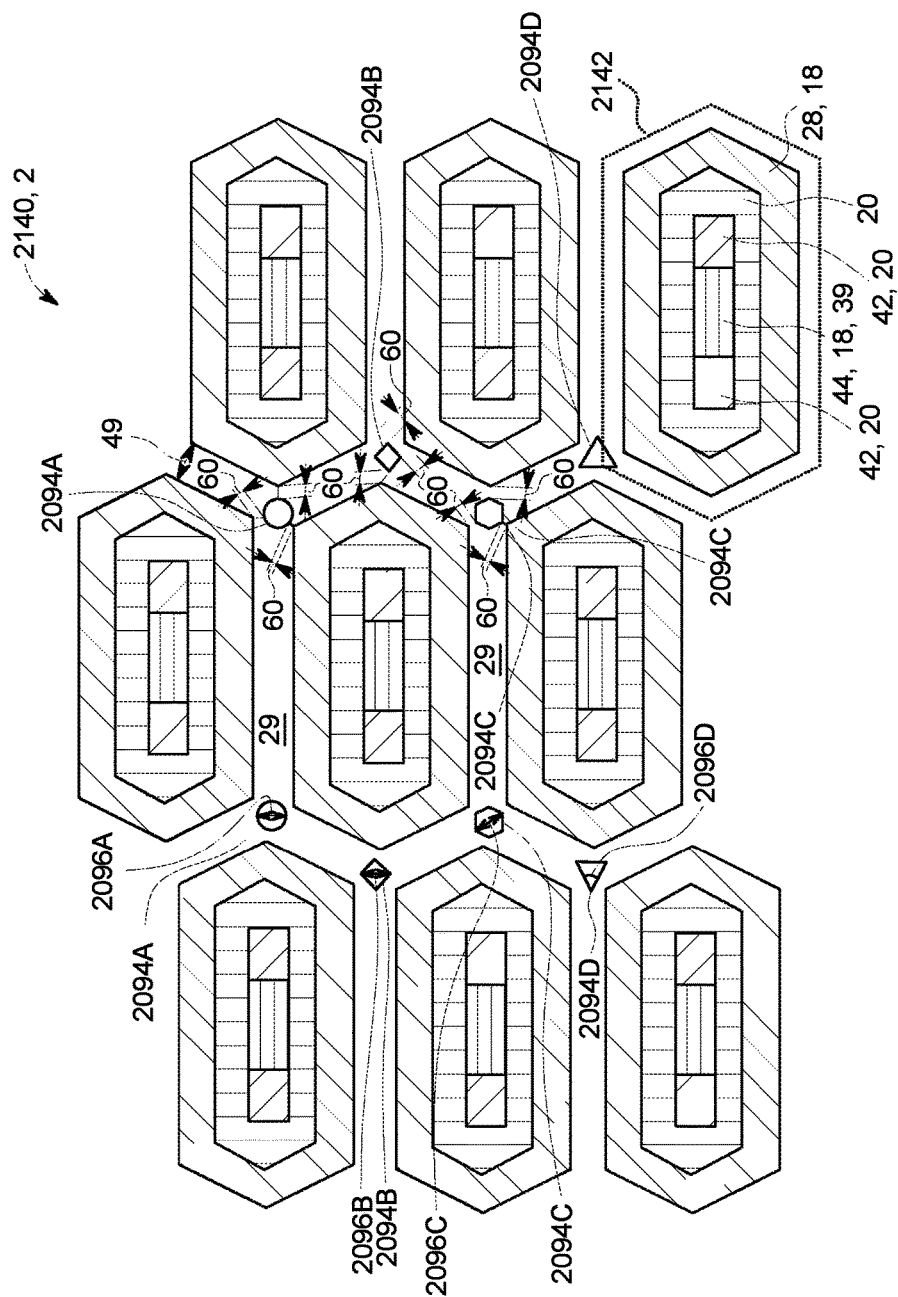
FIG. 12 is a top-down view of a device layout that includes a number of elongated hexagonal device cells and differently shaped disconnected shielding regions, in accordance with embodiments of the present technique.
Figure 13:
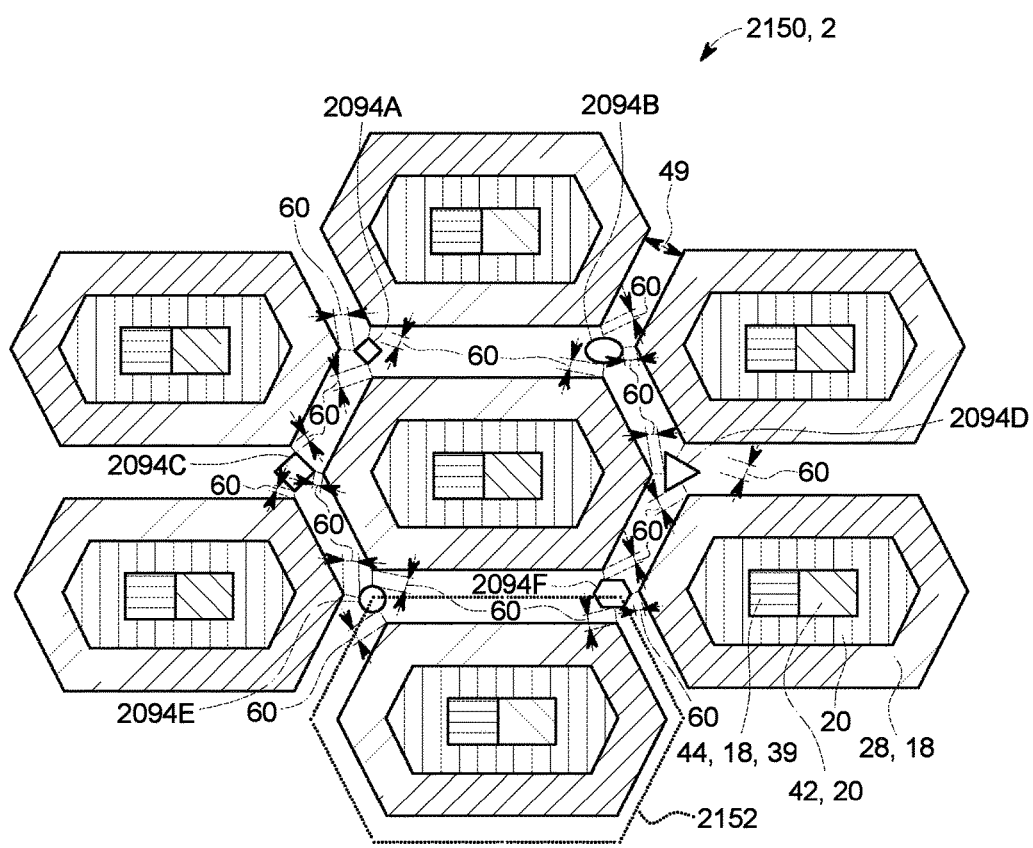
FIG. 13 is a top-down view of a device layout that includes a number of elongated hexagonal device cells and differently shaped disconnected shielding regions, in accordance with embodiments of the present technique.
Figure 14:
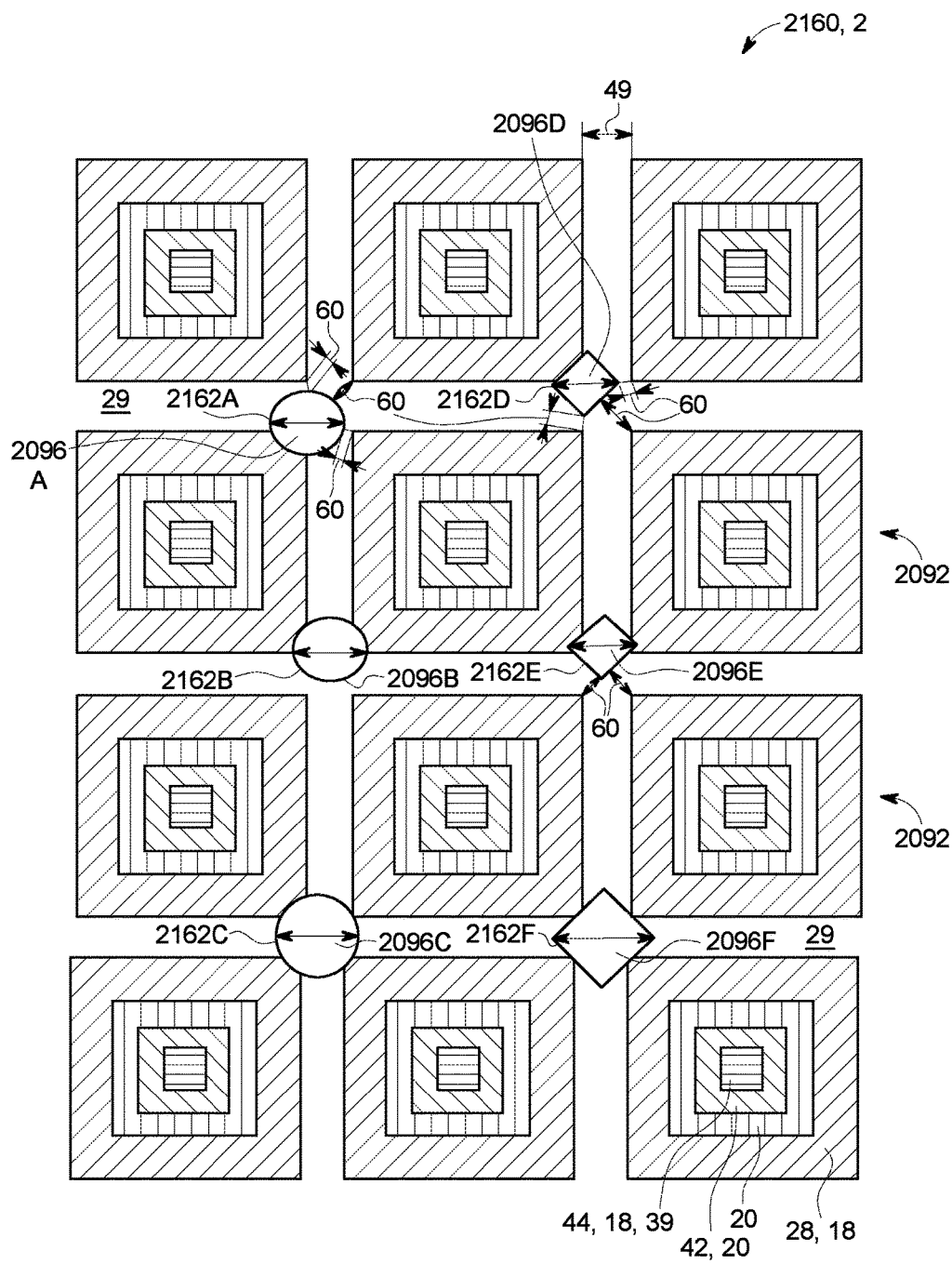
FIG. 14 is a top-down view of a device layout that includes a number of square device cells with differently shaped connected shielding regions overlapping with the channel regions of one or more device cells, in accordance with embodiments of the present technique.
Figure 15:
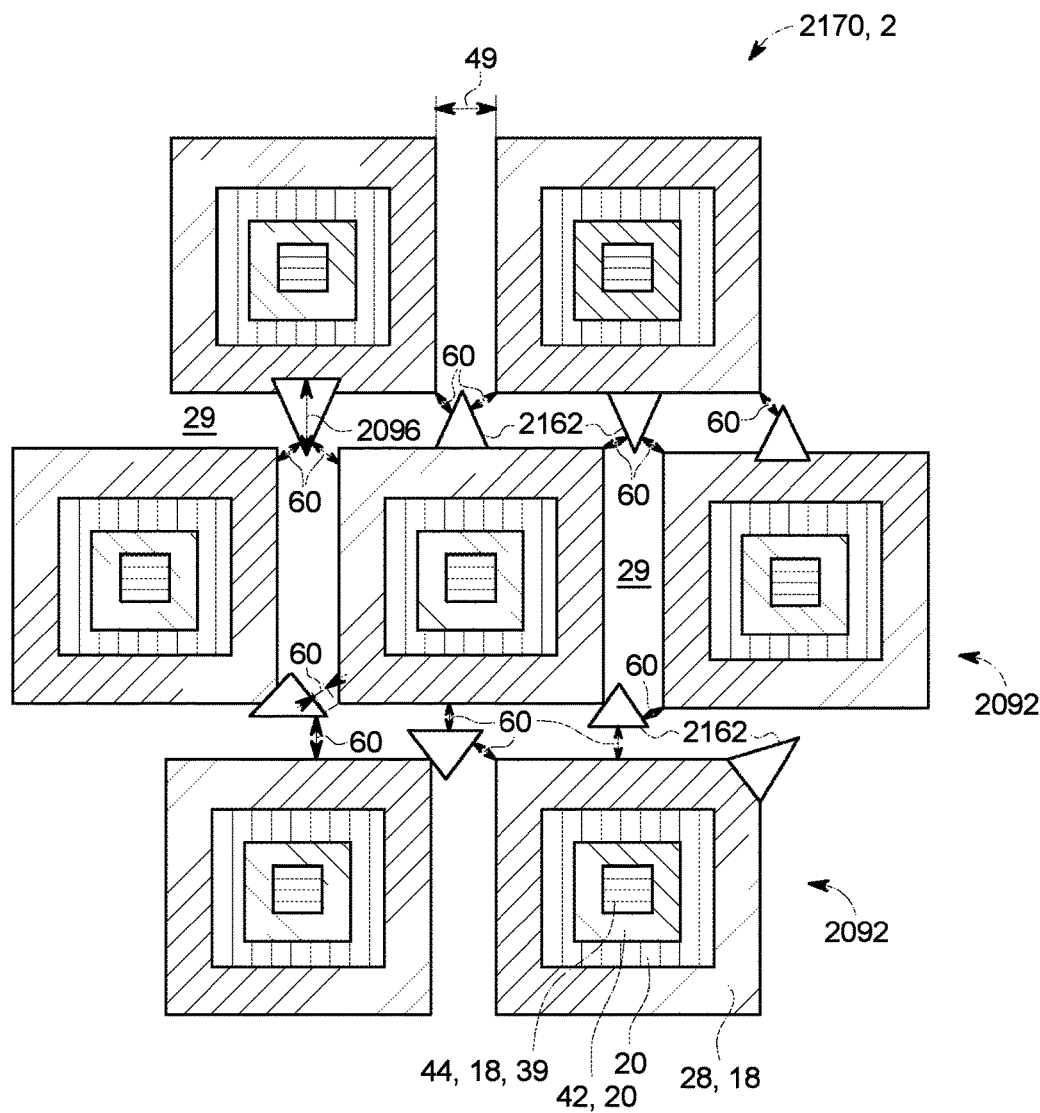
FIG. 15 is a top-down view of a device layout that includes a number of staggered, square device cells with connected shielding regions overlapping with the channel regions of one or more device cells, in accordance with embodiments of the present technique.
Figure 16:
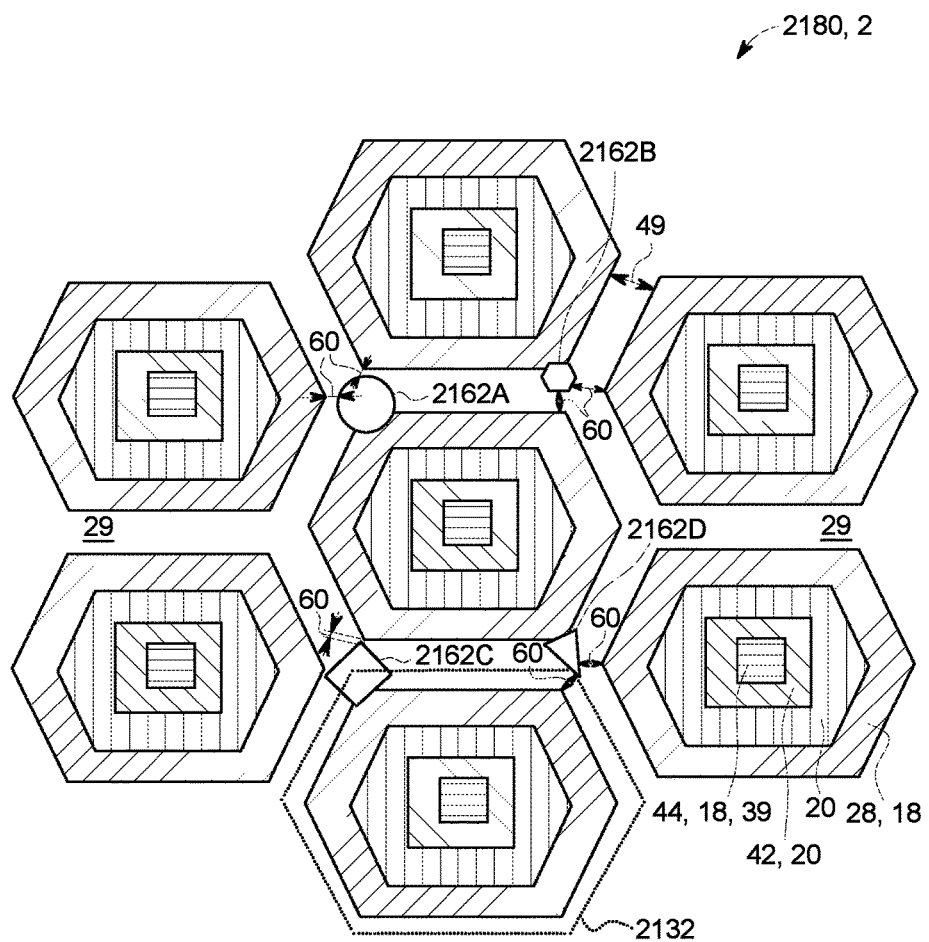
FIG. 16 is a top-down view of a device layout that includes a number of hexagonal device cells with connected shielding regions overlapping with the channel regions of one or more device cells, in accordance with embodiments of the present technique.

FIGS. 8-16 illustrate top-down views of embodiments of a semiconductor device layer 2 with various device cells and layouts that include at least one disconnected or connected shielding regions to reduce the peak electric field in the portion of JFET region 29 between the well regions 18 of neighboring device cells. More specifically, FIGS. 8-10 illustrate example layouts of square device cells that are shielded by disconnected shielding regions, FIG. 11 illustrates an example layout of hexagonal device cells that are shielded by disconnected shielding regions, FIGS. 12 and 13 illustrate example layouts of elongated hexagonal device cells that are shielded by disconnected shielding regions, FIGS. 14 and 15 illustrate example layouts of square device cells that are shielded by connected shielding regions, and FIG. 16 illustrates an example layouts of hexagonal device cells that are shielded by connected shielding regions, in accordance with embodiments of the present approach. It may be noted that, for efficiency, in FIGS. 11-16, a number of different differently shaped and sized shielding regions are illustrated together in the same device layout having different shapes to represent a number of different design options. It should be appreciated that, in certain embodiments, a device layout may only include shielding regions having substantially the same size and shape, while in other embodiments, a device layout may include shielding regions having different sizes and/or shapes. Additionally, the elongated hexagonal device cells of FIGS. 12 and 13 may include one or more features described in co-pending U.S. patent application Ser. Nos. 14/313,785 and 14/313,820, both entitled, "CELLULAR LAYOUT FOR SEMICONDUCTOR DEVICES," both filed Jun. 24, 2014, which are incorporated by reference herein in their entireties for all purposes. It may be appreciated that while a number of different example embodiments of device designs and layouts are presented, these are merely intended to be examples. As such, in other embodiments, shielding regions of the present approach may have other shapes (e.g., elongated, distorted, or irregular shapes) without negating the effect of the present approach. It also may be appreciated that the channel and/or JFET density of the disclosed cellular layout embodiments illustrated in FIGS. 8-16 is generally greater than that of a stripe device layout 41, as illustrated in FIG. 2, having the same process/technology limited design parameters.

With the foregoing in mind, FIG. 8 illustrates a portion of a device layout 2090 that includes a number of square device cells 2092 and a disconnected shielding region 2094, in accordance with embodiments of the present technique. In particular, the illustrated shielding region 2094 is disposed in the JFET region 29 between the corners of the well regions 18 of neighboring device cells 2092. The shielding region 2094 illustrated in FIG. 8 is substantially round and has a width 2096 (i.e., diameter 2096). As discussed below, the shielding regions may have other shapes (e.g., triangles, hexagons, ovals) and/or other widths (e.g., more narrow, wider, variable or changing widths), in accordance with embodiments of the present approach. As discussed above, the disconnected shielding region 2094 generally ensures that all of the distances 60 between the shielding region 2094 and adjacent well regions 18 (e.g., between regions have the second type of conductivity) are less than the distance 49 between parallel portions of the well regions 18 of neighboring cells 2092. In other words, the disconnected shielding regions 2094 generally ensure that no portion of the JFET region 29 is wider than $W_{JFET,parallel}$ 49, thereby reducing the peak electric field in the portion of the JFET region 29 between the corners of the well regions of neighboring device cells 2092. It may further be noted that the disclosed shielding regions, like the embodiment of the disconnected shielding region illustrated in FIG. 8, provide a reduction peak electric field when moving along the arrow 2102.

Figure 7B:
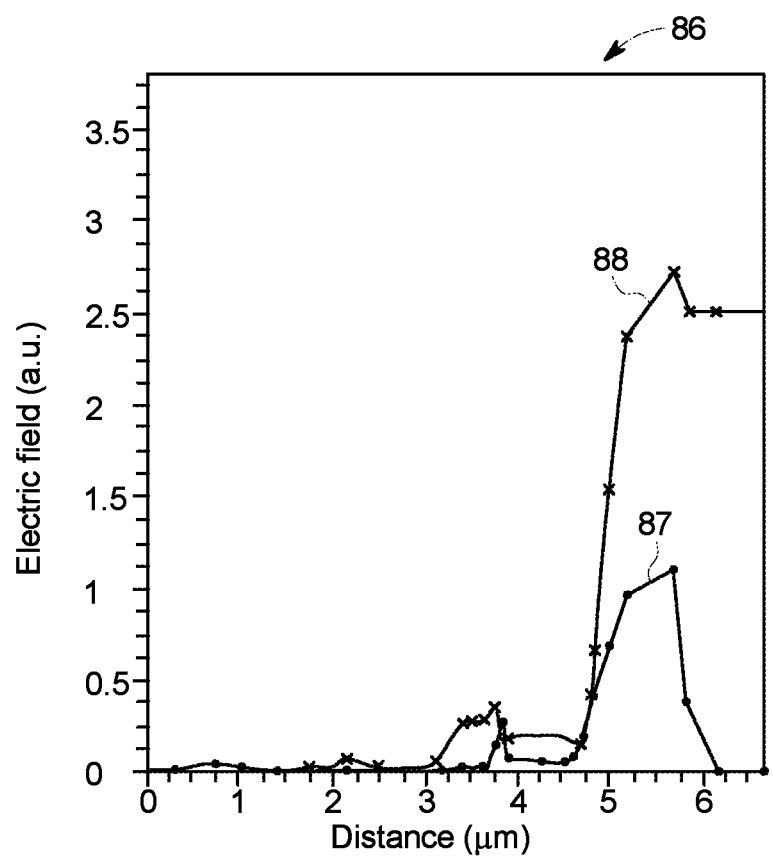
FIG. 7B is a graph depicting normalized electric field strength in a portion of a SiC layer and in a portion of a dielectric layer disposed over the SiC layer, wherein the portion of the SiC layer is disposed between the corners of the well regions of square device cells that are shielded by a disconnected shielding region and operating reverse bias, in accordance with embodiments of the present technique.

To illustrate the improvement provided by the disclosed shielding regions 2094, FIG. 7B is a graph 86 that plots the magnitude of the electric field (in the same arbitrary units (a.u.) as FIGS. 6 and 7A) for portions of an embodiment of a SiC device cell 2092 of FIG. 8 under reverse bias, wherein the particular portions of the device cell 2092 are disposed along the diagonal arrow 1098 illustrated in FIG. 8. Like FIGS. 6 and 7A, the graph 86 of FIG. 7B includes a first curve 87 illustrating the electric field in the SiC layer 2, and includes a second curve 88 illustrating the electric field in the dielectric layer 24 disposed over the SiC layer 2 (as illustrated in FIGS. 1A and 1B), for an example SiC device cell 2092 having the same dimensions as the unshielded device cells represented in FIGS. 6 and 7A. As illustrated in FIG. 7B, at the center 65 of the SiC device cell 2092 (i.e., at x=0 µm) the electric field in both the SiC layer 2 and the dielectric layer 24 is low, and, moving diagonally through the corner of the device cell 2092, the electric field increases to a peak field strength (i.e., at approximately x=5.5 µm) before reaching the shielding region 2094 (i.e., at approximately x=5.75 µm), and thereafter the magnitude of the electric field sharply declines. A corresponding decline is also observed in the dielectric layer 24, as illustrated by the curve 88. Comparing FIGS. 7A and 7B, the peak or maximum electric field between the corners of the well regions of the shielded SiC device cells 2092 (i.e., along the arrow 2012) of FIG. 8 is approximately 20% lower than the peak or maximum electric field between the corners (i.e., along the arrow 66) for the unshielded SiC square cells 50 of FIG. 3, and the same as or less than that in between parallel portions of the well regions 18 (e.g., as illustrated in FIG. 6). As a result, as shown in FIG. 7B, the peak electric field in the dielectric layer 24 is lower in the portion of the JFET region 29 that is between the corners of the well regions of neighboring device cells 2092, which may result in improved long term reliability for these SiC device cells 2092.

FIG. 9 illustrates a portion of a device layout 2110 that includes a number of square device cells 2092 and differently shaped disconnected shielding regions 2094A and 2094B, in accordance with embodiments of the present technique. It may be noted that, for the disconnected shielding regions 2094A and 2094B, as well as for other disclosed disconnected shielding regions, the shielding regions do not extend into or occupy a portion of the channel regions 28 (well region 18) of the device cells 2092, and therefore do not reduce the channel density of the layout 2110. The shielding region 2094A illustrated in FIG. 9 is substantially round and has a diameter 2096A that defines the width 2096A of the shielding region 2094A, while the shielding region 2094B is substantially square shaped and has a width 2096B. As generally illustrated by FIG. 9, in certain embodiments, shielding regions 2094 having different shapes may be used within the same layout. The disconnected shielding regions 2094A and 2094B generally ensure that all of the distances 60 between the shielding regions and the adjacent well regions 18 (e.g., between regions have the second type of conductivity) are less than the distance 49 between parallel portions of the well regions 18 of neighboring cells 2092. In other words, the disconnected shielding regions 2094 generally ensure that no portion of the JFET region 29 is wider than $W_{JFET,parallel}$ 49. Furthermore, the illustrated shielding regions 2094A and 2094B may be described as being substantially equidistant from the adjacent well regions of device cells 2092, while in other embodiments, the distances between a shielding region and the adjacent well regions of device cells 2092 can be different values that are generally less than $W_{JFET}$ 49.

FIG. 10 illustrates a portion of a device layout 2120 that includes a number of staggered, square device cells 2092 and disconnected shielding regions 2094, in accordance with embodiments of the present technique. The shielding region 2094 illustrated in FIG. 10 are substantially triangular and each have a respective width 2096. As such, the disconnected shielding regions 2094 generally ensure that all of the distances 60 between a shielding region 2094 and the adjacent well regions 18 (e.g., between regions have the second type of conductivity) are less than the distance 49 between parallel portions of the well regions 18 of neighboring cells 2092. In other words, the disconnected shielding regions 2094 generally ensure that no portion of the JFET region 29 is wider than $W_{JFET,parallel}$ 49.

FIG. 11 illustrates a portion of a device layout 2130 that includes a number of hexagonal device cells 2132 and disconnected shielding regions 2094A, 2094B, 2094C, and 2094D, in accordance with embodiments of the present technique. The shielding region 2094A illustrated in FIG. 11 has a substantially triangular shape and a width 2096A, the shielding region 2094B has a substantially square shape and a width 2096B, the shielding region 2094C has a substantially hexagonal shape and a width 2096C, and the shielding region 2094D has a substantially round shape and a width 2096D. The shielding regions 2094A, 2094B, 2094C, and 2094D generally ensure that all of the distances 60 between a shielding region and the adjacent well regions 18 (e.g., between regions have the second type of conductivity) are less than the distance 49 between parallel portions of the well regions 18 of neighboring cells 2132. In other words, the disconnected shielding regions 2094 generally ensure that no portion of the JFET region 29 is wider than $W_{JFET,parallel}$ 49.

FIG. 12 illustrates a portion of a device layout 2140 that includes a number of elongated hexagonal device cells 2142 and disconnected shielding regions 2094A, 2094B, 2094C, and 2094D, in accordance with embodiments of the present technique. The shielding regions 2094A illustrated in FIG. 12 have a substantially round shape and a width 2096A, the shielding regions 2094B have a substantially square shape and a width 2096B, the shielding regions 2094C have a substantially hexagonal shape and a width 2096C, and the shielding regions 2094D have a substantially triangular shape and a width 2096D. The shielding regions 2094A, 2094B, 2094C, and 2094D generally ensure that all of the distances 60 between a shielding region and the adjacent well regions 18 (e.g., between regions have the second type of conductivity) are less than the distance 49 between parallel portions of the well regions 18 of neighboring cells 2142. In other words, the disconnected shielding regions 2094 generally ensure that no portion of the JFET region 29 is wider than $W_{JFET,parallel}$ 49.

FIG. 13 illustrates a portion of a device layout 2150 that includes a number of elongated hexagonal device cells 2152 and disconnected shielding regions 2094A, 2094B, 2094C, 2094D, 2094E, and 2094F, in accordance with embodiments of the present technique. The shielding region 2094A illustrated in FIG. 13 has a substantially square shape, the shielding region 2094B has a substantially ovular shape, the shielding region 2094C has a substantially rectangular shape, the shielding region 2094D has a substantially triangular shape, the shielding region 94E has a substantially round or circular shape, and the shielding region 94F has a substantially hexagonal shape. The shielding regions 2094A, 2094B, 2094C, 2094D, 2094E, and 2094F generally ensure that all of the distances 60 between a shielding region and the adjacent well regions 18 (e.g., between regions have the second type of conductivity) are less than the distance 49 between parallel portions of the well regions 18 of neighboring cells 2152. In other words, the disconnected shielding regions 2094 generally ensure that no portion of the JFET region 29 is wider than $W_{JFET,parallel}$ 49.

FIG. 14 illustrates a portion of a device layout 2160 that includes a number of square device cells 2092 and connected shielding regions 2162A, 2162B, 2162C, 2162D, 2162E, and 2162F having different sizes and shapes, in accordance with embodiments of the present technique. It may be noted that, unlike the disconnected shielding regions discussed above, the disclosed connected shielding regions do occupy a portion of the channel/well region of at least one adjacent device cell, thereby at least partially reducing the channel density of the device layout. The connected shielding regions 2162A, 2162B, and 2162C illustrated in FIG. 14 have a substantially round or ovular shape, while the shielding regions 2162D, 2162E, and 2162F have a substantially square shape. Additionally, the shielding region 2162A has a width 2096A and overlaps with a portion (e.g., a corner) of the channel region 28 of a single device cell 2092, such that the distances 60 between the shielding region 2162A and the well regions 18 of the remaining adjacent device cells 2092 are less than $W_{JFET}$ 49. The shielding region 2162B has a width 2096B and overlaps with a corner of the channel region 28 of two neighboring device cells 92, such that the distances 60 between the shielding region 2162A and the remaining adjacent device cells 92 is less than $W_{JFET}$ 49. The shielding region 2162C has a width 2096C and overlaps with a corner of the channel region 28 of four neighboring device cells 2092 (e.g., all adjacent device cells 2092). The shielding region 2162D has a width 2096D and overlaps with a corner of the channel region 28 of a single device cell 2092, such that the distances 60 between the shielding region 2162D and a well regions 18 of the remaining adjacent device cells 92 are less than $W_{JFET}$ 49. The shielding region 2162E has a width 2096E and overlaps with a corner of the channel region 28 of two neighboring device cells 2092, such that the distances 60 between the shielding region 2162E and a well regions 18 of the remaining adjacent device cells 2092 are less than $W_{JFET}$ 49. The shielding region 2162F has a width 2096F and overlaps with a corner of the channel region 28 of four neighboring device cells 2092 (e.g., all adjacent device cells 2092). The shielding regions 2162A, 2162B, 2162C, 2162D, 2162E, and 2162F generally ensure that all of the distances 60 between a shielding region and the adjacent well regions 18 (e.g., between regions have the second type of conductivity) are less than the distance 49 between parallel portions of the well regions 18 of neighboring cells 2092. In other words, the disconnected shielding regions 2162 generally ensure that no portion of the JFET region 29 is wider than $W_{JFET,parallel}$ 49.

FIG. 15 is a device layout 2170 that includes a number of staggered, square device cells 2092 with connected shielding regions 2162, in accordance with embodiments of the present technique. Each of the connected shielding regions 2162 illustrated in FIG. 15 have a respective width 2096, and each overlaps with either a corner or a side the channel region 28/well region 18 of a single device cell 2092. Additionally, two shielding regions slightly overlap with the channel region 28/well region 18 of the device cell 2092 in the center of the illustrated layout 2170. The shielding regions 2162 generally ensure that all of the distances 60 between a shielding region 2162 and adjacent well regions 18 (e.g., between regions have the second type of conductivity) are less than the distance 49 between parallel portions of the well regions 18 of neighboring cells 2092. In other words, the disconnected shielding regions 2162 generally ensure that no portion of the JFET region 29 is wider than $W_{JFET,parallel}$ 49.

FIG. 16 illustrates a device layout 2180 that includes a number of hexagonal device cells 2132 with connected shielding regions 2162 of different shapes, in accordance with embodiments of the present technique. The shielding region 2162A illustrated in FIG. 16 has a substantially round or circular shape, the shielding region 2162B has a substantially hexagonal shape, the shielding region 2162C has a substantially square shape, and the shielding region 2162D has a substantially triangular shape. Each of the shielding regions 2162A, 2162B, 2162C, and 2162D overlaps with the channel region 28/well region 18 of a single device cell 2132, while two shielding regions, namely 2162A and 2162D, overlap with the channel region 28/well region 18 of the device cell 2132 in the middle of the layout 2180. As mentioned, the shielding regions 2162A, 2162B, 2162C, and 2162D are positioned such that the distances 60 between the shielding regions 2162A, 2162B, 2162C, and 2162D and the well regions 18 of adjacent device cell 2132 are less than the distance 49 (i.e., $W_{JFET}$ 49) between parallel portions of well regions of neighboring device cells 2132.

Technical effects of the present disclosure include cellular device designs that incorporate one or more shielding regions, in the form of either disconnected or connected shielding regions, that reduce the peak electric field in what would be the widest portion of JFET regions, between the well regions of device cells, without significantly increasing $R_{ds}(on)$. The disclosed shielding regions are designed to reduce the width of the portion of the JFET region to less than $W_{JFET,parallel}$, while maintaining a channel region width and/or a JFET region density that is greater than that of a conventional stripe device of comparable dimensions. Accordingly, the presently disclosed shielded device cells provide superior performance relative to a conventional stripe device of comparable dimensions, while still providing similar reliability (e.g., long-term, high-temperature stability at reverse bias). Furthermore, the shielding regions of the presently disclosed cellular designs may be fabricated (e.g. implanted) simultaneously with other features of the device cells, and as such, do not increase the complexity or cost of fabrication.

The invention claimed is:

1. A device, comprising:
a plurality of device cells at least partially disposed in a semiconductor device layer having a first conductivity type, wherein each device cell of the plurality comprises:
a body contact region having a second conductivity type;
a source region having the first conductivity type disposed adjacent to the body contact region of the device cell; and
a channel region having the second conductivity type disposed adjacent to the source region;
a JFET region having the first conductivity type disposed between the channel regions of the plurality of device cells, wherein the JFET region has a parallel JFET width between a well region of the device cell and a parallel portion of a well region of a neighboring device cell of the plurality of device cells; and
plurality of shielding regions having the second conductivity type disposed in a widest portion of the JFET region, wherein each shielding region of the plurality of shielding regions is positioned such that a distance between the shielding region and a portion of an adjacent device cell having the second conductivity type is less than the parallel JFET width, wherein the semiconductor device layer is a silicon carbide (SiC) semiconductor device layer and the plurality of shielding regions overlaps with a portion of the channel regions of the plurality of device cells and does not overlap with a portion of the source regions of the plurality of device cells.

2. The device of claim 1, wherein each of the plurality of shielding regions overlaps with the channel regions of more than one of the plurality of device cells.

3. The device of claim 2, wherein each of the plurality of shielding regions overlaps with the channel regions of more than two of the plurality of device cells.

4. The device of claim 3, wherein each of the plurality of shielding regions overlaps with the channel regions of all adjacent device cells of the plurality of device cells.

5. The device of claim 1, wherein each of the plurality of shielding regions has a substantially triangular, circular, ovular, hexagonal, rectangular, or an irregular shape.

6. The device of claim 5, wherein the plurality of shielding regions are substantially equidistant from the channel regions of the plurality of device cells.

7. The device of claim 1, wherein the plurality of shielding regions have substantially the same dopant concentration and depth as the body contact regions of the plurality of device cells.

8. The device of claim 1, comprising an ohmic contact disposed over the body contact regions of the plurality of device cells and over the plurality of shielding regions.

9. The device of claim 1, wherein each of the plurality of shielding regions comprise a width that is between approximately 0.1 µm and approximately 2 µm.

10. The device of claim 9, wherein the width is between approximately 0.2 µm and 1 µm.

11. The device of claim 1, wherein at least a portion of the plurality of shielding regions have a different size, shape, or both, than the remainder of the plurality of shielding regions.

12. The device of claim 1, wherein the plurality of device cells comprises a field effect transistor (FET), an insulated gate bipolar transistor (IGBT), an insulated base MOS-controlled thyristor (IBMCT), or a combination thereof.

13. The device of claim 1, wherein each of the plurality of shielding regions has a substantially triangular, circular, ovular, hexagonal, rectangular, or an irregular shape and the plurality of shielding regions are substantially equidistant from the channel regions of the plurality of device cells.

14. The device of claim 13, wherein the plurality of shielding regions have substantially the same dopant concentration and depth as the body contact regions of the plurality of device cells.

15. The device of claim 13, comprising an ohmic contact disposed over the body contact regions of the plurality of device cells and over the plurality of shielding regions.

16. The device of claim 13, wherein each of the plurality of shielding regions comprise a width that is between approximately 0.1 µm and approximately 2 µm.

17. The device of claim 16, wherein the width is between approximately 0.2 µm and 1 µm.

18. The device of claim 13, wherein at least a portion of the plurality of shielding regions have a different size, shape, or both, than the remainder of the plurality of shielding regions.

* * * * *